US009189373B2

(12) United States Patent
Kaur

(10) Patent No.: US 9,189,373 B2
(45) Date of Patent: *Nov. 17, 2015

(54) AUTOMATED TOP DOWN PROCESS TO MINIMIZE TEST CONFIGURATIONS FOR MULTI-FEATURE PRODUCTS

(71) Applicant: Intel Corporation, Santa Clara, CA (US)

(72) Inventor: Satwant Kaur, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/140,080

(22) Filed: Dec. 24, 2013

(65) Prior Publication Data

US 2014/0122936 A1    May 1, 2014

Related U.S. Application Data

(63) Continuation of application No. 12/765,426, filed on Apr. 22, 2010, now Pat. No. 8,621,426, which is a continuation-in-part of application No. 12/709,540, filed on Feb. 22, 2010, now Pat. No. 8,539,446.

(51) Int. Cl.
*G06F 9/44* (2006.01)
*G06F 11/36* (2006.01)
*G06F 17/50* (2006.01)
*G06Q 10/06* (2012.01)

(52) U.S. Cl.
CPC ........ *G06F 11/3684* (2013.01); *G06F 11/3672* (2013.01); *G06F 17/50* (2013.01); *G06Q 10/06* (2013.01)

(58) Field of Classification Search
None
See application file for complete search history.

(56) References Cited

U.S. PATENT DOCUMENTS

| | | | | |
|---|---|---|---|---|
| 8,539,446 | B2 * | 9/2013 | Kaur | 717/121 |
| 8,621,426 | B2 * | 12/2013 | Kaur | 717/106 |
| 2004/0243968 | A1 | 12/2004 | Hecksel | |
| 2010/0192135 | A1 | 7/2010 | Krishnaswamy et al. | |
| 2010/0235433 | A1 | 9/2010 | Ansari et al. | |
| 2011/0209123 | A1 | 8/2011 | Kaur | |
| 2011/0209124 | A1 | 8/2011 | Kaur | |

OTHER PUBLICATIONS

Non-Final Office Action received for U.S. Appl. No. 12/765,426, mailed Feb. 28, 2013, 13 pages.
Non-Final Office Action received for U.S. Appl. No. 12/709,540, mailed Sep. 10, 2012, 8 pages.
Final Office Action received for U.S. Appl. No. 12/709,540, mailed Mar. 6, 2013, 6 pages.
Notice of Allowance received for U.S. Appl. No. 12/709,540, mailed on May 23, 2013, 8 pages.
Notice of Allowance received for U.S. Appl. No. 12/765,426, mailed on Aug. 28, 2013, 17 pages.

* cited by examiner

*Primary Examiner* — Chuck Kendall
(74) *Attorney, Agent, or Firm* — Jordan IP Law, LLC

(57) ABSTRACT

Systems and methods of conducting interoperability assessments provide for generating a feature interoperability matrix based on feature data and interoperability data, wherein the feature data defines a plurality of features of a product and the interoperability data indicates levels of interoperability of the plurality of features. A validation set can be generated based on the feature interoperability matrix, wherein the validation set includes a plurality of feature combinations. A subfeature interoperability matrix can be used to convert the validation set into a test plan for the product, wherein the test plan minimizes test configurations for the product.

20 Claims, 6 Drawing Sheets

34

```
function getFullyInteroperableFeatureCombos(interopMatrix):
    Queue combosToExtend = [ ]
    combosToExtend.enque( [ ] ) //init with 1 element: the empty set
    List combosToReturn = [ ]
    while not combosToExtend.isEmpty():
        comboToExtend = combosToExtend.dequeue( )
        newCombos = extendCombo(comboToExtend, interopMatrix)
        combosToExtend.addAll( newCombos )
        combosToReturn.add( combo )
    return combosToReturn;

function extendCombo(comboToExtend, interopMatrix):
    extendedCombos = [ ]
    minf = -1     //new feature must be greater than other features of this combo
    if not comboToExtend.isEmpty():
        minf = comboToExtend.lastElement()
    for newf between (minf+1, M.length())://try every possible new feature
        if interoperableWithAll(comboToExtend, newf, interopMatrix):
            newCombo = new List(combosToExtend)
            newCombo.add(newf )
            extentedCombos.append( newCombo );
    return extendedCombos;

function interoperableWithAll(comboToExtend, newf, M)
    foreach oldf in comboToExtend:
        if not M[oldf][newf] == 1:
            return false;
    return true;
```

```
#returns all vulnerable feature pairs in a feature combo
#Checks if they are vulnerable using the vulnerability matrix function
extractVulnerableFeaturePairs(combo, matrix)
        pairs = []
        for i in range(0,len(combo)):
                for j in range(i+1,len(combo)): #foreach pair
                        if(matrix[i][j]==1): #Check if pair is vulnerable
                                pairs.add([i,j]);   return pairs;
```

```
#returns all platform exercises for a feature pair
#input 1: exf1 – List<exercise>[], for each subfeature in feature1 contains a list of feature
exercises
#input 2: exf2   List<exercise>[], for each subfeature in feature2 contains a list of feature
exercises
#input 3: subfeature vulnerability matrix
function generatePlatformExercises(exf1, exf2, matrix)
        pExercises = [] # list of platform exercises
        for i in range(0,len(matrix)):
                for j in range(0,len(matrix[0])): #foreach subfeaturepair
                        if(matrix[i][j]==1): #Check if pair is vulnerable
                                ex=new List().addAll(exf1[i]).addAll(exf2[j])
                                #run exercises simultaneously
                                subf=new List().addAll(i).addAll(j)
                                #to test both subfeatures
                                pEx=new PlatformExercise(ex,subf);
                                pExercises.add(pEx);
                                #add new platform exercise
        pExercises=combinePlatformExercises(pExercises);
        return pExercises;
```

98

```
# Returns a new set of platform exercises
# Which are not a subset of any other platform exercise in the set
function combinePlatformExercises(pExercises):
        for e1 in oldpExercises:
                for e2 in oldpExercises:
                        if(e1==e2):
                        #only combine 2 different exercises
                                continue;
                        if(e1.ex.containsAll(e2.ex)):
                                e1.subf.addAll(e2.subf);
                                #exercise1 tests exercise2's subfeatures
                                pExercises.delete(e2);
                                #don't run exercise2
                                break;
```

FIG. 8

AUTOMATED TOP DOWN PROCESS TO MINIMIZE TEST CONFIGURATIONS FOR MULTI-FEATURE PRODUCTS

CROSS-REFERENCE TO RELATED APPLICATIONS

The present application is a continuation of U.S. application Ser. No. 12/765,426 filed Apr. 22, 2010 which is a continuation-in-part of U.S. application Ser. No. 12/709,540 filed on Feb. 22, 2010 now U.S. Pat. No. 8,539,446.

BACKGROUND

1. Technical Field

Embodiments generally relate to product validation. In particular, embodiments relate to the generation of reduced interoperability validation sets and minimization of test configurations for multi-feature products.

2. Discussion

Conventional approaches to platform interoperability validation may involve testing more feature combinations and/or platform configurations than necessary, expending a substantial amount of manual effort to reduce the number of feature combinations to be tested, or both. For example, a platform with n features could result in $2^n$ feature combinations to be validated on each platform configuration. Accordingly, a platform with twenty features might have more than a million feature combinations that may potentially be validated on each of hundreds of platform configurations, and validating each feature combination may further require thousands of test cases.

BRIEF DESCRIPTION OF THE DRAWINGS

The various advantages of the embodiments of the present invention will become apparent to one skilled in the art by reading the following specification and appended claims, and by referencing the following drawings, in which:

FIG. 3 is a listing of an example of pseudo code to generate a reduced interoperability validation set according to an embodiment;

FIG. 7 is a listing of an example of pseudo code to identify vulnerable feature pairs according to an embodiment;

FIG. 8 is a listing of an example of pseudo code to generate a list of platform exercises according to an embodiment.

DETAILED DESCRIPTION

Figure 1:
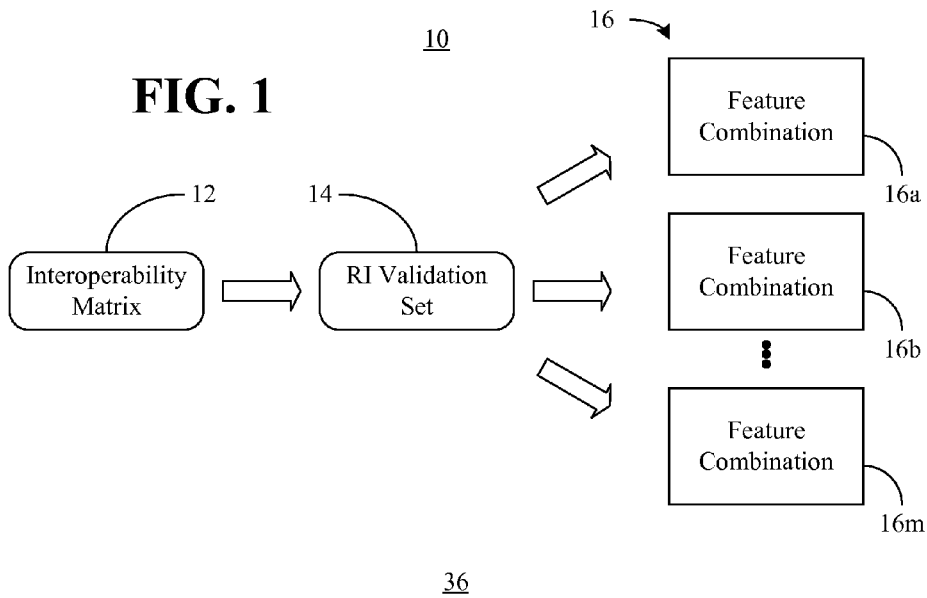
FIG. 1 is a block diagram of an example of a scheme of minimizing feature combinations for a product according to an embodiment.

Embodiments may provide for a computer readable storage medium comprising a set of instructions which, if executed by a processor, cause a computer to identify a feature combination for a product, and expand the feature combination to include an additional feature only if the additional feature is interoperable with all features in the feature combination and the additional feature is new to the feature combination. The instructions may also cause a computer to add the feature combination and the expanded feature combination to a validation set for the product.

Embodiments may also provide for a system including a processor and a memory including a set of stored instructions which, if executed by the processor, cause the system to identify a feature combination for a product. The instructions may also cause the system to expand the feature combination to include an additional feature only if the additional feature is interoperable with all features in the feature combination and the additional feature is new to the feature combination, and add the feature combination and the expanded feature combination to a validation set for the product.

Embodiments may also provide for a method of evaluating a platform in which an interoperability matrix is received. The interoperability matrix can indicate a level of operability of each feature of a platform with each other feature of the platform. The method can also involve identifying a feature combination based on the interoperability matrix, and expanding the feature combination to include an additional feature only if the additional feature is interoperable with all features in the feature combination and the additional feature is new to the feature combination. The feature combination and the expanded feature combination can be added to a validation set for the platform. The method may further involve testing the platform based on the validation set.

In addition, embodiments may provide for a method of performing a top down interoperability assessment in which a feature interoperability matrix is generated based on feature data and interoperability data, wherein the feature data can define a plurality of features of a product and the interoperability data can indicate levels of interoperability of the plurality of features. A validation set may be generated based on the feature interoperability matrix, where the validation set can include a plurality of feature combinations. The method may also provide for identifying a plurality of feature pairs based on the validation set and the feature interoperability matrix and receiving a subfeature interoperability matrix for each of the plurality of feature pairs. A test plan can be generated for the product based on the subfeature interoperability matrix and dependency data for the plurality of features.

Embodiments may also provide for a computer readable storage medium comprising a set of instructions which, if executed by a processor, cause a computer to identify a feature pair of a product, a first set of subfeatures for the feature pair, and a second set of subfeatures for the feature pair. The instructions may also cause a computer to receive a subfeature interoperability matrix, wherein the subfeature interoperability matrix is to indicate a level of interoperability of the first and second sets of subfeatures. In addition, the instructions can cause a computer to generate a test plan to include a list of platform exercises based on the subfeature interoperability matrix and a plurality of exercises associated with the first and second sets of subfeatures.

Other embodiments may include a system having a processor and a memory with a set of stored instructions which, if executed by the processor, cause the system to identify a feature pair of a product, a first set of subfeatures for the feature pair, and a second set of subfeatures for the feature pair. The instructions may also cause the system to receive a subfeature interoperability matrix, wherein the subfeature interoperability matrix is to indicate a level of interoperability of the first and second sets of subfeatures. In addition, the instructions can cause the system to generate a test plan to include a list of platform exercises based on the subfeature interoperability matrix and a plurality of exercises associated with the first and second sets of subfeatures.

Embodiments may also provide for a method of evaluating a product in which a feature combination is identified for the product. The feature combination can be expanded to include an additional feature only if the additional feature is interoperable with all features in the feature combination and the additional feature is new to the feature combination. The method may also provide for adding the feature combination and the expanded feature combination to a validation set for the product.

FIG. 1 shows a scheme 10 of minimizing feature combinations for a multi-feature product to be validated. The product might be a platform with computing functionality (e.g., laptop, desktop, server, personal digital assistant/PDA), communications functionality (e.g., wireless phone), imaging functionality, media playing functionality, or any combination thereof. In addition, the product could be a vehicle (e.g., automobile, aircraft), business machine (e.g., copier, printer, facsimile machine, scanner), or other multi-feature product whose features should interoperate correctly. In the case of a computing platform, for example, the features might be related to dynamic power performance management (DPPM), hybrid graphics, active management technology (e.g., AMT 7.0, Intel® Corporation), identity protection technology, video playback data path protection (e.g., PAVP 2.0, Intel® Corporation), basic input/output system (BIOS) attribute management, and so on. The illustrated example provides for transforming an interoperability matrix 12 into a reduced interoperability (RI) validation set 14, which in turn provides for a plurality of feature combinations 16 (16a-16m) to be tested in one or more product configurations. As will be discussed in greater detail, the illustrated RI validation set 14 can significantly reduce the product validation overhead, time and cost by minimizing the number of feature combinations 16 to be tested.

Generally, the interoperability matrix 12 can indicate the level of operability of each feature of the product with respect to each other feature of the product. For example, Table I below demonstrates one approach in which the level of operability indicates whether a feature is interoperable (1), incompatible (−1), or non-intersecting (0) with another feature of the product.

TABLE I

| Interop. Matrix | Feature A | Feature B | Feature C | Feature D | Feature E | Feature F |
|---|---|---|---|---|---|---|
| Feature A | 1 | 1 | 0 | 0 | 1 | 0 |
| Feature B | 1 | 1 | −1 | 0 | 1 | 0 |
| Feature C | 0 | −1 | 1 | 1 | 1 | 1 |
| Feature D | 0 | 0 | 1 | 1 | 1 | 1 |
| Feature E | 1 | 1 | 1 | 1 | 1 | 1 |
| Feature F | 0 | 0 | 1 | 1 | 1 | 1 |

The interoperability matrix 12 may be generated by carrying out interoperability architectural assessments of features on the product. For example, each feature architect might list the interoperability of their feature with every other feature. Even if there is only partial evidence that a feature pair is interoperable, an entry can be included for validation consideration. The result may be a symmetrical matrix where interoperability $[f_i, f_j]$=interoperability $[f_j, f_i]$.

Figure 2:
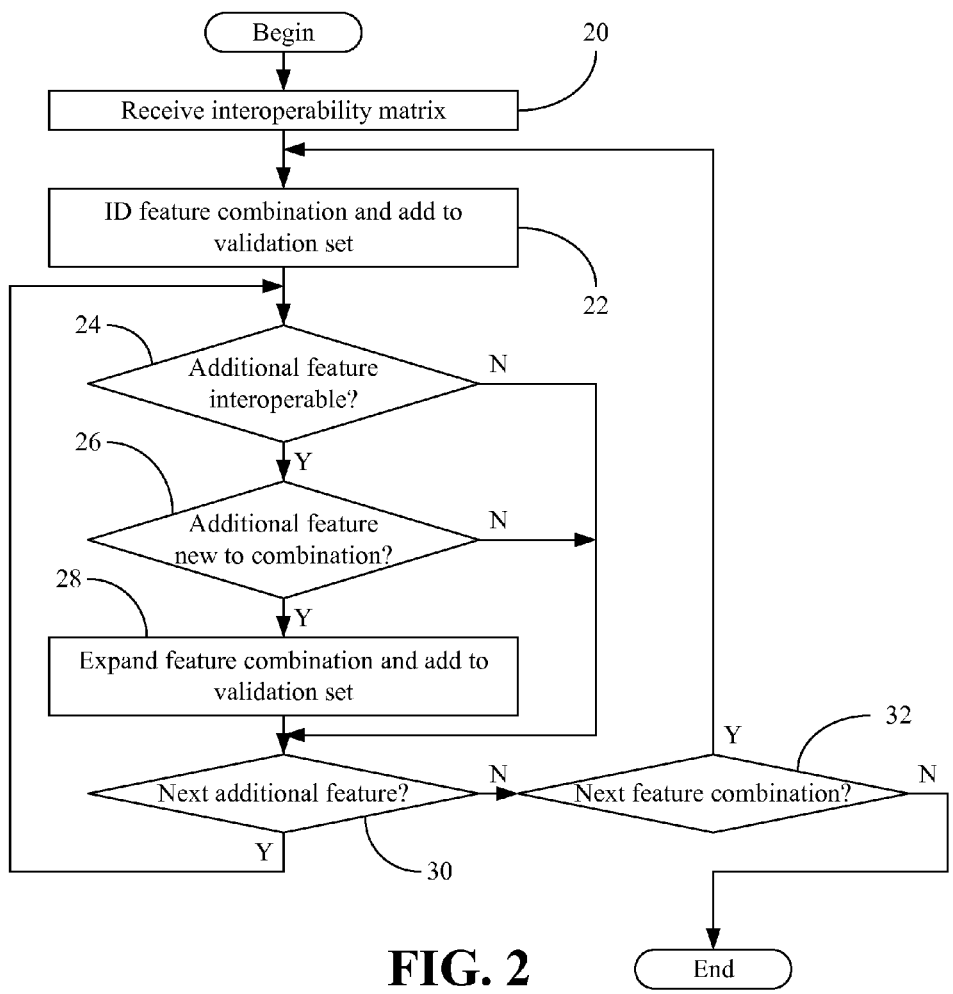
FIG. 2 is a flowchart of an example of a method of generating a reduced interoperability validation set according to an embodiment.

FIG. 2 shows a method 18 of generating an RI validation set 14 (FIG. 1) based on an interoperability matrix 12 (FIG. 1). The method 18 may be implemented in executable software (SW) as a set of logic instructions stored in a machine- or computer-readable medium of a memory such as random access memory (RAM), read only memory (ROM), programmable ROM (PROM), flash memory, etc., in fixed-functionality hardware (HW) using circuit technology such as application specific integrated circuit (ASIC), complementary metal oxide semiconductor (CMOS) or transistor-transistor logic (TTL) technology, or any combination thereof. For example, computer program code to carry out operations shown in method 18 may be written in any combination of one or more programming languages, including an object oriented programming language such as C++ or the like and conventional procedural programming languages, such as the "C" programming language or similar programming languages.

The illustrated approach generally leverages the fact that that any non-fully interoperable feature combination (i.e., a combination containing a feature that is not interoperable with all other features) may not be required for full validation. Moreover, if a feature combination contains a feature that is incompatible with any other feature, it may be considered an invalid combination. In addition, if a feature combination contains a feature that does not intersect with any other feature, the combination does not expose any new vulnerabilities above and beyond the set of fully interoperable subsets of the combination.

In particular, the illustrated processing block 20 provides for receiving an interoperability matrix. An interoperable feature combination can be identified at block 22 based on the interoperability matrix, wherein the feature combination might two-feature combination (i.e., feature pair). Block 22 may also add the feature combination to an RI validation set 14 (FIG. 1). Illustrated block 24 provides for determining whether an additional feature is interoperable with all features in the feature combination. If so, a determination may be made at block 26 as to whether the additional feature is new to the combination. If both conditions are true, the feature combination may be expanded at block 28 to include the additional feature, and the expanded feature combination can be added to the RI validation set 14 (FIG. 1). Otherwise, the feature combination is not expanded to include the additional feature. Illustrated block 30 checks for other additional features to be considered, and provides for repeating the selective expansion process if another additional feature is present in the interoperability matrix. If another feature combination is present in the interoperability matrix, block 32 can provide for selecting the next feature combination and repeating the selective expansion process. The resulting RI validation set may be used to test the product in question.

Accordingly, the RI validation set 14 (FIG. 1) can be substantially smaller than it may normally be under conventional brute force techniques. For example, Table II below demonstrates an RI validation set in matrix format for the interoperability matrix shown in Table I, wherein the "1" entries show which features are part of the combination to be validated.

TABLE II

| Combo to be Validated | Feature A | Feature B | Feature C | Feature D | Feature E | Feature F |
|---|---|---|---|---|---|---|
| 1 | 1 | 1 | 0 | 0 | 0 | 0 |
| 2 | 1 | 0 | 0 | 0 | 1 | 0 |
| 3 | 0 | 1 | 0 | 0 | 1 | 0 |
| 4 | 0 | 0 | 1 | 1 | 0 | 0 |
| 5 | 0 | 0 | 1 | 0 | 1 | 0 |
| 6 | 0 | 0 | 1 | 0 | 0 | 1 |
| 7 | 0 | 0 | 0 | 1 | 1 | 0 |
| 8 | 0 | 0 | 0 | 1 | 0 | 1 |
| 9 | 0 | 0 | 0 | 0 | 1 | 1 |
| 10 | 1 | 1 | 0 | 0 | 1 | 0 |
| 11 | 0 | 0 | 1 | 1 | 1 | 0 |
| 12 | 0 | 0 | 1 | 1 | 0 | 1 |
| 13 | 0 | 0 | 1 | 0 | 1 | 1 |
| 14 | 0 | 0 | 0 | 1 | 1 | 1 |
| 15 | 0 | 0 | 1 | 1 | 1 | 1 |

Thus, the complete set of combinations to be validated can be substantially smaller than the $2^n$ possible combinations that may result from the conventional approach, and yet enables validation all of the potential vulnerabilities of the platform as captured in the interoperability matrix.

It has been determined that the reduction in the number of validations may vary with the sparseness of "1's" in the interoperability matrix. Table III below demonstrates the number of feature combinations and the maximum feature size as the sparseness of the "1' s" in the interoperability matrix is varied.

TABLE III

| Test # | Density of 1's in Interoperability Matrix | Longest Feature Combos (max 20) | No. of Feature Combo (max 1,048,576) |
|---|---|---|---|
| 1 | 32% | 5 | 125 |
| 2 | 38% | 6 | 236 |
| 3 | 43% | 6 | 328 |
| 4 | 48% | 7 | 520 |
| 5 | 61% | 7 | 1260 |
| 6 | 80% | 11 | 13824 |

FIG. 3 shows one example of pseudo code 34 capable of generating an RI validation set based on an interoperability matrix (e.g., argument "interopMatrix"). Generally, the illustrated pseudo code 34 selectively extends each n feature combination to generate multiple n+1 feature combinations. Each of the n+1 feature combinations can be created by appending an additional feature that is interoperable (e.g., function "interoperableWithAll") with all existing n features in the combination. The initial set may begin with one two-feature combination, and the algorithm can terminate when no new combinations can be formed by extending an existing combination. The illustrated pseudo code 34 also allows appending an additional feature only when the extended combination will be "greater" (according to any consistent ordering) than all existing features in the combination (e.g., function "extendCombo"). Simply put, a feature combination may be expanded only if the additional feature is new to the feature combination. Such an approach can enable the system to avoid regenerating different permutations of the same feature set.

Figure 4:
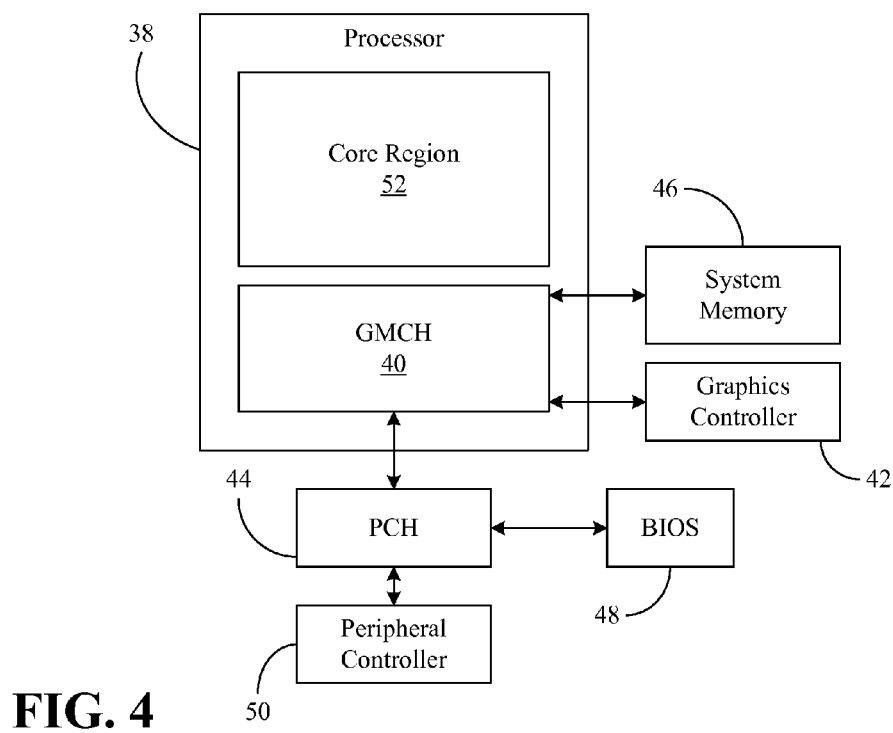
FIG. 4 is a block diagram of an example of a system according to an embodiment.

Turning now to FIG. 4, a computing system 36 is shown. The system 36 may be a portion of a computing platform such as a server, desktop, test system, design/debug tool, laptop, personal digital assistant (PDA), mobile Internet device (MID), wireless smart phone, media player, imaging device, or any other suitable apparatus. In the illustrated example, the system 36 includes a processor 38, a graphics memory controller hub (GMCH) 40, a graphics controller 42, a platform controller hub (PCH) 44, system memory 46, basic input/output system (BIOS) memory 48 and one or more peripheral controllers 50. The illustrated processor 38, which may include a core region 52 with one or several processor cores and various cache levels (not shown), is integrated with the GMCH 40 onto a common system on chip (SoC). Alternatively, the processor 38 could communicate with the GMCH 40 over an interface such as a front side bus (FSB), a point-to-point interconnect fabric, or any other suitable interface. The GMCH 40, which is sometimes referred to as a Northbridge, can communicate with the system memory 46 via a memory bus, wherein the system memory 46 might include dynamic random access memory (DRAM) modules that could be incorporated into a single inline memory module (SIMM), dual inline memory module (DIMM), small outline DIMM (SODIMM), and so on.

The GMCH 40 may also communicate with the graphics controller 42 via a graphics bus such as a PCI Express Graphics (PEG, e.g., Peripheral Components Interconnect/PCI Express x16 Graphics 150W-ATX Specification 1.0, PCI Special Interest Group) bus, or Accelerated Graphics Port (e.g., AGP V3.0 Interface Specification, September 2002) bus. In addition, the GMCH 40 may communicate with the PCH 44, which may be referred to as a Southbridge, over a hub bus. In one embodiment, the hub bus is a DMI (Direct Media Interface) bus. The PCH 44 could also be incorporated with the processor 38 and GMCH 40 onto a common SoC. The illustrated system 36 also has one or more peripheral controllers 50 such as a WLAN (wireless local area network) Wi-Fi (e.g., Institute of Electronics Engineers/IEEE 802.11a, b, g, n) network interface, an Ethernet controller (e.g., IEEE 802.3), PC Card controller (e.g, CardBus PCMCIA standard), and so on. Thus, the peripheral controllers 50 may provide access to external memory such as a hard disk drive (HDD), optical disk, and/or flash memory.

The PCH 44 may also have internal controllers such as USB (Universal Serial Bus, e.g., USB Specification 2.0, USB Implementers Forum), Serial ATA (SATA, e.g., SATA Rev. 3.0 Specification, May 27, 2009, SATA International Organization/SATA-IO), High Definition Audio, and other controllers.

Thus, the system memory 46, external memory, and/or caches of the processor 38 may be configured to store a set of instructions which, if executed by the processor 38, cause the system 36 to identify a feature combination for a product, and expand the feature combination to include an additional feature only if the additional feature is interoperable with all features in the feature combination and the additional feature is new to the feature combination. The instructions could also add the feature combination and the feature combination to a validation set for the product.

The above techniques may therefore provide for a validation set that is complete (e.g., can exercise all multi-dimensional interoperability vulnerabilities), non-redundant (e.g., may eliminate duplication of feature level validation on different platform configurations, small-sized (e.g., can minimize the size of combinations to be validated), minimal (e.g., may be a function of the density of input feature level interactions—reducing the number of combinations from more than a million to a few hundred), and unique (e.g., can have a signature that is unique to the input interoperability matrix). The result may be a reduction in the validation resources required, including personnel and computer hardware. Moreover, significant reductions in cost and time to market can be realized using the techniques described herein.

Additional Embodiments

Figure 5:
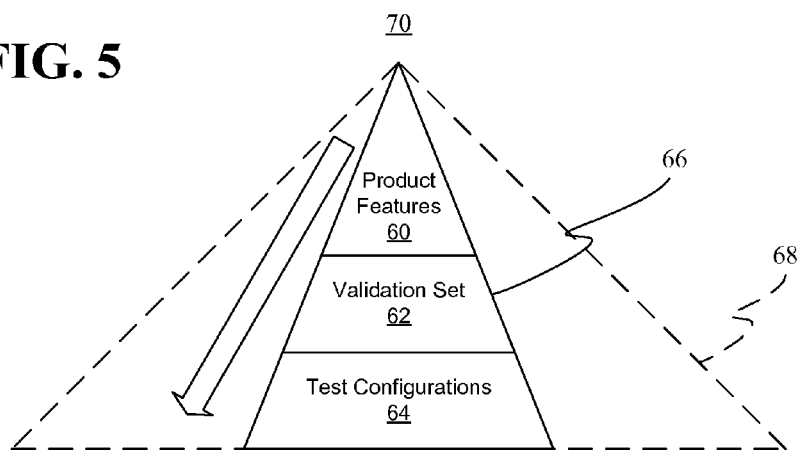
FIG. 5 is a block diagram of an example of a top down interoperability assessment scheme according to an embodiment.

The above-described approach can also be used as part of an automated top down process of conducting interoperability architectural assessments and analyses. For example, FIG. 5 shows a top down scheme 70 in which product features 60 are used to identify a validation set 62, which in turn enables the determination of test configurations 64. The illustrated example has a much narrower profile 66 relative to a profile 68 of a reactive conventional approach that can involve the design and testing of platform features in isolation of one another. In particular, illustrated scheme 70 focuses on interactions between features and can substantially reduce the number of test configurations 64 needed to validate the product.

The process may begin with a definition of system components (e.g., hardware, software, etc.) at the correct granularity. For example, a component definition can be large enough so that the interactions between components are minimized, yet small enough to be either completely in or completely out of any system configuration. Once the component definitions are generated, the process may also involve capturing areas of interaction between system components, wherein data from multiple sources (e.g., individuals such as feature architects) could be analyzed in templates, as part of assessment discussions, and so on.

Figure 6:
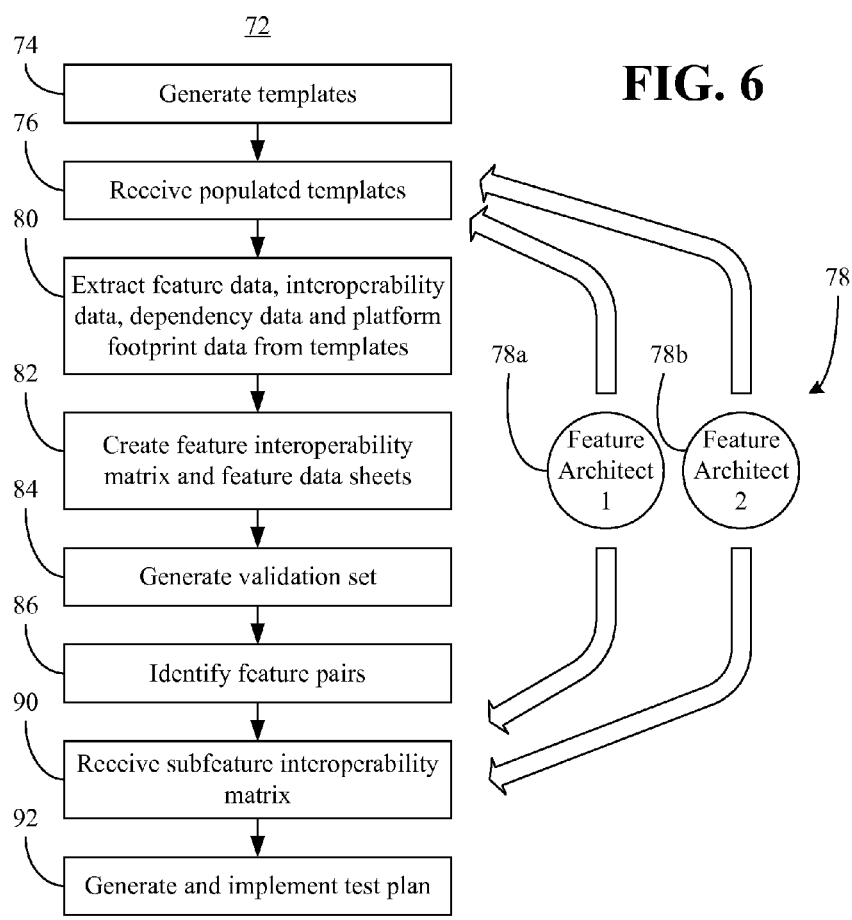
FIG. 6 is a flowchart of an example of a method of conducting a top down interoperability assessment according to an embodiment.

FIG. 6 demonstrates a method 72 of using a top down architectural assessment process to minimize test configurations for platforms. The method 72 may be implemented in executable software as a set of logic instructions stored in a machine- or computer-readable medium of a memory such as RAM, ROM, PROM, flash memory, etc., in fixed-functionality hardware using circuit technology such as ASIC, CMOS or TTL technology, or any combination thereof. For example, computer program code to carry out operations shown in method 72 may be written in any combination of one or more programming languages, including an object oriented programming language such as C++ or the like and conventional procedural programming languages, such as the "C" programming language or similar programming languages. The code could be executed by a processor to cause a system such as system 36 (FIG. 4) to minimize test configurations for a multi-feature product.

In the illustrated example, processing block 74 provides for generating a plurality of templates, wherein the templates may be provided to a plurality of feature architects 78 (78a-78b). A plurality of populated templates can be received at block 76, wherein the populated templates may include feature data, interoperability data, dependency data, platform footprint data, etc. Other user interface (UI) techniques such as web portals and/or electronic forms may also be used to obtain the appropriate data from the feature architects. Table IV below shows an example of a portion of a template for a feature (Feature C) involving remote platform management.

TABLE IV

| | Data on Platform Feature | |
|---|---|---|
| Feature Overview | Feature Name | Feature C |
| | Architect/Owner | John Doe |
| | Feature Short Description | Version 7.0 of active management technology (AMT) |
| | Feature Overview | Feature C allows remote management of platforms through out of band communications, implementing features such as remote power control, asset management, media redirection, KVM (keyboard, video and mouse) redirection etc. |

Thus, each template might enable the associated feature architect 78 to specify feature data such as the name, short description and overview of the feature. As will be discussed in greater detail, the feature data may be used to create feature data sheets. Table V below shows that the templates can also be used to collect platform footprint data.

TABLE V

| | Data on Platform Feature | | | |
|---|---|---|---|---|
| | | | • | |
| | | | • | |
| | | | • | |
| | Year | Operating System | In Platform 0 = no; 1 = yes | Comments |
| Operating System | 2011 | OS 1 | 1 | |
| | | OS 2 | 1 | |
| | | OS n | 0 | |
| | | Others | 1 | OS i |
| | 2012 | OS 1 | 1 | |
| | | OS 2 | 1 | |
| | | OS n | 0 | |
| | | Others | 1 | OS i |
| | Year | Platform Name - Segment | In Platform 0 = no; 1 = yes | Comments |
| Platform and Market Segment | 2011 | Platform 1 - Ch a | 0 | |
| | | Platform 1 - Ch b | 0 | |
| | | Platform 2 - Ch c | 1 | |
| | | Platform n | 1 | |
| | | Others | 0 | |
| | 2012 | Platform 1 - Ch a | 0 | |
| | | Platform 1 - Ch b | 0 | |
| | | Platform 2 - Ch c | 1 | |

TABLE V-continued

| | | Data on Platform Feature | | |
|---|---|---|---|---|
| | | Platform n | 1 | |
| | | Others | 0 | |
| | Vector | Metric (specify CPU, clock, # of cores, platform in comments) | Quantitative Assessment Numeric Values | Comments |
| Feature Platform Footprint | Performance | CPU utilization (%) | 2.00 | low, consumed by local agents |
| | | Boot time adder - S5 resume (sec) | 0.00 | on a "normal boot" |
| | | S5 shutdown time adder (sec) | 0.00 | |
| | Memory | FW flash size estimate (KB) | 500.00 | |
| | | Shared/system SPI NOR flash (KB) | 800.00 | |
| | Thermal | Platform TDP adder (watt) | 0.00 | |
| | Power | EPA ES: Poff adder (watt) | 0.00 | |
| | | EPA ES: Psleep adder (watt) | 0.00 | |
| | | Platform active power adder (watt) | 0.30 | |

The platform footprint data could identify the operating system (OS), platform, market segment, as well as the performance, memory, thermal and power metrics of the feature. As will be discussed in greater detail, the platform footprint data might be used in conjunction with various thresholds to determine feature interoperability. Table VI below shows that the templates may also enable the collection of interoperability data, which can indicate the levels of interoperability of the features of the platform.

TABLE VI

| Attribute | ID | Feature | Interop interaction | Details |
|---|---|---|---|---|
| Platform Features | 1 | Feature A | 0 | |
| | 2 | Feature B | 1 | C works only in integrated graphics mode |
| | 3 | Feature C | 0 | Self |
| | 4 | Feature D | 1 | OS 1 kernel; D uses crypto protocols implemented in OS 1 firmware (FW) |
| | 5 | Feature E | 1 | C common services |
| | 6 | Feature F | 0 | |

Thus, in the example shown, Feature C interacts only with Features B, D and E. In addition, dependency data such as subfeature data and exercise data may be obtained via the templates, as shown in Table VII below.

TABLE VII

| Data on Platform Feature | |
|---|---|
| • | |
| • | |
| Dependencies | Comments |
| Subfeature c1: CPU | |
| Subfeature c2: PCH | |
| Subfeature c3: BIOS tables | |
| Subfeature c4: management engine BIOS extension | |
| Subfeature c5: manageability upgrade | |
| Subfeature c6: LAN HW & SW | |
| Subfeature c7: WLAN HW & SW | |

Thus, in the illustrated example, Feature C has a corresponding set of seven subfeatures, wherein Subfeature c1 depends upon the central processing unit (CPU), Subfeature c2 depends upon the platform controller hub (PCH), and so on. These dependencies can be the basis of exercises to be performed during the testing phase of the process. Simply put, the subfeature data can identify a set of subfeatures and the exercise data can identify one or more exercises to be conducted for each subfeature.

Processing block 80 provides for extracting the feature data, interoperability data, dependency data and platform footprint data from the templates, wherein a feature interoperability matrix and feature data sheets can be created at block 82 based on the extracted data. The feature data sheets may serve as a valuable reference tool to the feature architects 78 and other participants in the architectural analysis process. The feature interoperability matrix, such as the matrix illustrated in Table I above, can be generated based on the interoperability data extracted from each template as well as from the platform footprint data. With regard to the use of platform footprint data, a determination can be made as to whether each feature pair (or feature configuration) would exceed a particular platform threshold (e.g., power threshold, performance threshold, memory threshold, thermal threshold, etc.). For example, the platform might have a maximum CPU utilization of 90%, whereas a pair of features in combination could require more than 90% CPU utilization. If so, the feature pair can be automatically indicated as being incompatible in the feature interoperability matrix. As a result, the feature pair would be effectively excluded from the validation set 62 (FIG. 5).

A validation set may be generated at block 84 based on the feature interoperability matrix, wherein the validation set can include a plurality of feature combinations, as already discussed.

Illustrated block 86 provides for identifying the feature pairs of the validation set combinations. FIG. 7 shows one example of pseudo code 88 capable of automatically extracting (e.g., function "extractVulnerableFeaturePairs") the vulnerable pairs of the validation set based on the feature interoperability matrix (e.g., argument "matrix") and each validation set combination (e.g., argument "combo"). In particular, the illustrated pseudo code 88 adds a combination feature pair to a list if the feature interoperability matrix indicates that the feature pair is interoperable.

Returning now to FIG. 6, a subfeature interoperability matrix may be received at block 90 for each of the plurality of feature pairs. The subfeature interoperability matrices, which might be obtained from the feature architects 78, can indicate the level of interoperability of the subfeatures associated with the feature pair in question. The feature architects 78 may split each feature into subfeatures by examining the list of dependencies of the feature and organizing them as a list of subfeatures. Some dependencies may not be a subfeature. Then, for each subfeature, the feature architect 78 may list the related exercises, wherein subfeatures with no exercises might be ignored as they typically are not tested. Table VII below shows an example of a subfeature interoperability matrix.

TABLE VII

| Subfeature Interoperability Matrix for Feature C & Feature D | Subfeature d3: EPID key management FW | Subfeature d10: integrated graphics HW & SW | Subfeature d12: ME kernel |
|---|---|---|---|
| Subfeature c2: PCH | 0 | 0 | 0 |
| Subfeature c4: management engine BIOS extension | 1 | 0 | 0 |
| Subfeature c5: manageability upgrade | 0 | 0 | 0 |
| Subfeature c7: WLAN HW & SW | 0 | 0 | 0 |

The illustrated subfeature interoperability matrix reflects only the dependencies that are subfeatures and only the subfeatures that have exercises. Such an approach can significantly reduce the processing and analysis overhead to identify interoperability interactions. In the example shown, there is only a single intersection between the subfeatures of Feature C and the subfeatures of Feature D. Block 92 provides for generating a test plan for the product based on the subfeature interoperability matrix and dependency data for the plurality of features, wherein the test plan can include a list of platform exercises. Accordingly, in the example of Table VII, a platform exercise could be constructed to simultaneously test subfeatures c4 and d3 while management engine BIOS extensions and EPID (enhanced privacy identification) key authentication is being used.

FIG. 8 shows one example of pseudo code 94 capable of automatically generating (e.g., function "generatePlatformExercises") a listing of platform exercises for a feature pair. In the illustrated example, the pseudo code 94 includes a routine 96 in which the subfeature interoperability matrix (e.g., argument "matrix") is searched for pair of subfeatures that are interoperable. In the particular example of Table VII, subfeatures c2 and d3 would correspond to such a subfeature pair. If an interoperable subfeature pair is detected, the subfeature pair can be combined, along with the exercises corresponding to subfeatures in the pair (e.g., arguments "exf1" and "exf2"), into a platform exercise. Thus, in the particular example of Table VII, subfeature c4 and its corresponding exercise, the use of management engine BIOS extensions, as well as subfeature d3 and its corresponding exercise, the use of EPID key authentication, can be combined into a platform exercise for simultaneous testing. The platform exercise may then be added to a list of platform exercises.

The illustrated pseudo code 94 also includes a routine 98 in which platform exercises that are a subset of another platform exercise may be eliminated (e.g., function "combinePlatformExercises") from the test plan. In particular, if it is determined that a first platform exercise contains all exercises of a second platform exercise, the subfeatures of the second platform exercise may be added to the first platform exercise and the redundant second platform exercise may be deleted. Simply put, the illustrated approach reduces the number of tests by selecting which feature pairs to run, and reduces the test size by selecting which feature exercises to run simultaneously for a feature pair.

Figure 9:
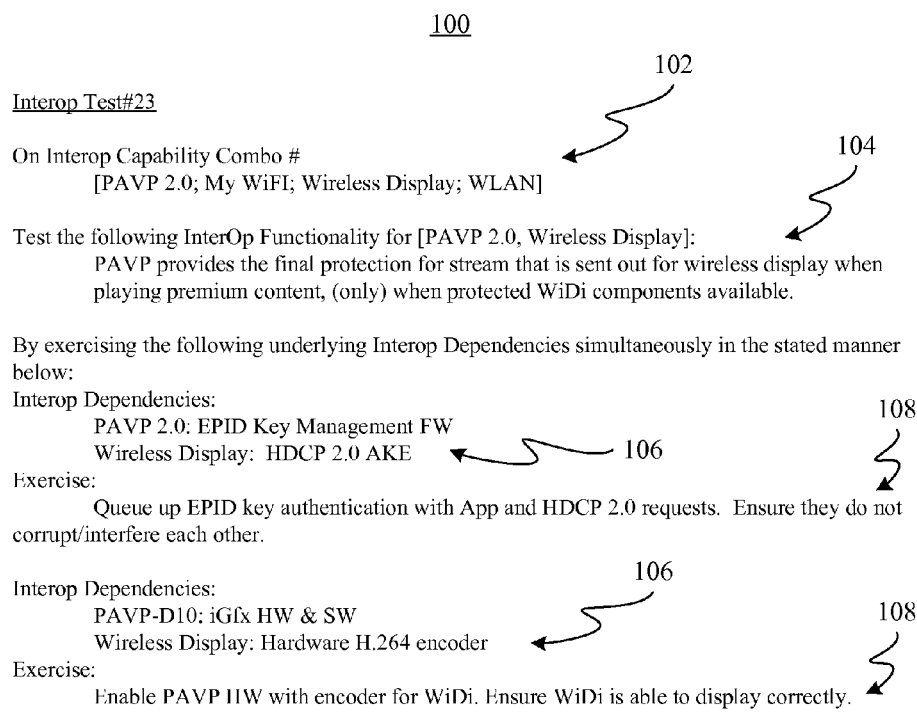
FIG. 9 is a listing of an example of test case instructions according to an embodiment.

Turning now to FIG. 9, test case instructions 100 may be constructed from configuration information 102, functionality information 104, dependency information 106 and exercise information 108 of a particular test configuration. In the illustrated example, the feature combination of PAVP 2.0, My WiFi, Wireless Display, and WLAN is tested for the feature pair of PAVP 2.0 and Wireless Display.

To demonstrate the impact of the above-described test and exercise reduction techniques, the upper bound on the number of tests and exercises can be determined and then compared to the actual number of tests and exercises obtained using the techniques described herein. For a platform with F number of features, each with S number of subfeatures, there would be $2^F$ feature configurations—each containing at most F features. Each feature configuration can require at most $F^2$ test configurations—testing every feature pair on the configuration. Each of those test configurations may require at most $S^2$ exercises—exercising every subfeature pair for a feature pair. Therefore, in the worst case, there could be $2^F*F^2*S^2$ exercises.

Thus, if F=20 features and S=up to 40 sub features per feature, the worst case scenario would yield $2^{20}=10^6$ feature configurations, each with $20^2=400$ test configurations, with each test requiring $40^2=1600$ exercises. For the entire platform, the number of test configurations would be $10^6*400=4*10^8*1600=6.4*10^{11}$ exercises. This number may be too prohibitive to implement entirely, so complete coverage of vulnerabilities might never be reached.

By using the techniques described herein, however, the number of feature configurations in the above example can be reduced from $10^6$ to just 523. The number of test configurations can then be reduced from $4*10^8$ to 3489 (from 400 to 46 unique tests). In addition, the number of exercises can be reduced from $6.4*10^{11}$ to 7252 exercises (from 1600 to 84 unique exercises). Accordingly, the reduced numbers enable complete testing of a platform and all of its configurations.

Embodiments described herein may be applicable for use with all types of semiconductor integrated circuit ("IC") chips. Examples of these IC chips include but are not limited to processors, controllers, chipset components, programmable logic arrays (PLA), memory chips, network chips, and the like. In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

I claim:

1. A non-transitory computer readable storage medium comprising a set of instructions which, if executed by a processor, cause a computer to:
   identify a feature combination of a product including two of more features, wherein each of the two or more features is to include a corresponding subfeature;
   examine each corresponding subfeature to identify an interoperable subfeature combination;
   identify an exercise associated with each corresponding subfeature of the interoperable subfeature combination; and
   combine each exercise associated with each corresponding subfeature of the interoperable subfeature combination to generate a platform exercise.

2. The medium of claim 1, wherein the instructions, if executed, further causes the computer to implement the platform exercise to simultaneously test each corresponding subfeature of the interoperable subfeature combination while each exercise associated with each corresponding subfeature is to be utilized.

3. The medium of claim 1, wherein the feature combination is to include a feature pair.

4. The medium of claim 1, wherein the instructions, if executed, further causes the computer to split the two or more features into the corresponding subfeature based on a corresponding dependency of the two or more features.

5. The medium of claim 4, the instructions, if executed, further causes the computer to:
   split a first feature into a first corresponding subfeature based on a corresponding dependency of the first feature, wherein the first corresponding subfeature is to include an associated exercise; and
   split a second feature into a second corresponding subfeature based on a corresponding dependency of the second feature, wherein the second corresponding subfeature is to include an associated exercise,
   wherein the associated exercise of the first corresponding subfeature and the associated exercise of the second corresponding subfeature are to be utilized in a platform test when the first corresponding subfeature and the second corresponding subfeature are interoperable.

6. The medium of claim 1, wherein the instructions, if executed, further causes the computer to ignore each corresponding subfeature without an associated exercise.

7. The medium of claim 1, wherein at least one of the two or more features is to include two or more corresponding subfeatures.

8. A method comprising utilizing a processor causing:
   identifying a feature combination of a product including two of more features, wherein each of the two or more features includes a corresponding subfeature;
   examining each corresponding subfeature to identify an interoperable subfeature combination;
   identifying an exercise associated with each corresponding subfeature of the interoperable subfeature combination; and
   combining each exercise associated with each corresponding subfeature of the interoperable subfeature combination to generate a platform exercise.

9. The method of claim 8, further including implementing the platform exercise to simultaneously test each corresponding subfeature of the interoperable subfeature combination while each exercise associated with each corresponding subfeature is utilized.

10. The method of claim 8, wherein the feature combination includes a feature pair.

11. The method of claim 8, further including splitting the two or more features into the corresponding subfeature based on a corresponding dependency of the two or more features.

12. The method of claim 11, further including:
- splitting a first feature into a first corresponding subfeature based on a corresponding dependency of the first feature, wherein the first corresponding subfeature includes an associated exercise; and
- splitting a second feature into a second corresponding subfeature based on a corresponding dependency of the second feature, wherein the second corresponding subfeature includes an associated exercise,
- wherein the associated exercise of the first corresponding subfeature and the associated exercise of the second corresponding subfeature are utilized in a platform test when the first corresponding subfeature and the second corresponding subfeature are interoperable.

13. The method of claim 8, further including ignoring each corresponding subfeature without an associated exercise.

14. The method of claim 8, wherein at least one of the two or more features includes two or more corresponding subfeatures.

15. A system comprising:
- a processor; and
- a memory including a set of stored instructions which, if executed by the processor, cause the system to,
  - identify a feature combination of a product including two of more features, wherein each of the two or more features is to include a corresponding subfeature;
  - examine each corresponding subfeature to identify an interoperable subfeature combination;
  - identify an exercise associated with each corresponding subfeature of the interoperable subfeature combination; and
  - combine each exercise associated with each corresponding subfeature of the interoperable subfeature combination to generate a platform exercise.

16. The system of claim 15, wherein the system is to implement the platform exercise to simultaneously test each corresponding subfeature of the interoperable subfeature combination while each exercise associated with each corresponding subfeature is to be utilized.

17. The system of claim 15, wherein the feature combination is to include a feature pair.

18. The system of claim 15, wherein the system is to split the two or more features into the corresponding subfeature based on a corresponding dependency of the two or more features.

19. The system of claim 18, wherein the system is to:
- split a first feature into a first corresponding subfeature based on a corresponding dependency of the first feature, wherein the first corresponding subfeature is to include an associated exercise; and
- split a second feature into a second corresponding subfeature based on a corresponding dependency of the second feature, wherein the second corresponding subfeature is to include an associated exercise,
- wherein the associated exercise of the first corresponding subfeature and the associated exercise of the second corresponding subfeature are to be utilized in a platform test when the first corresponding subfeature and the second corresponding subfeature are interoperable.

20. The system of claim 15, wherein the system is to ignore each corresponding subfeature without an associated exercise.

* * * * *